United States Patent [19]
Hueschen

[11] Patent Number: 5,872,355
[45] Date of Patent: Feb. 16, 1999

[54] ELECTROLUMINESCENT DEVICE AND FABRICATION METHOD FOR A LIGHT DETECTION SYSTEM

[75] Inventor: Mark R. Hueschen, Palo Alto, Calif.

[73] Assignee: Hewlett-Packard Company, Palo Alto, Calif.

[21] Appl. No.: 833,815

[22] Filed: Apr. 9, 1997

[51] Int. Cl.$^6$ .............................. H01J 40/14; H01L 33/00
[52] U.S. Cl. ................................ 250/208.1; 315/169.3; 257/79
[58] Field of Search ............................... 250/208.1, 216; 315/169.3, 169.4; 357/431, 460, 98, 99, 79

[56] References Cited

U.S. PATENT DOCUMENTS

| | | | |
|---|---|---|---|
| 4,075,654 | 2/1978 | Hara et al. | 257/460 |
| 5,254,849 | 10/1993 | Murakamie et al. | 250/208.1 |
| 5,491,384 | 2/1996 | Cheng et al. | 315/169.3 |

*Primary Examiner*—Stephone B. Allen

[57] ABSTRACT

A device for a light detection system includes an electroluminescent layer stack on a transparent member, such as a glass substrate, with at least one layer of the layer stack being patterned to define first and second electroluminescent regions spaced apart by a transparent light collection path for passage of backreflected light. The layer stack includes first and second electrode layers on opposed sides of one or more active layers. In one embodiment, the second electrode layer is the only layer that is patterned to define the light collection path. In this embodiment, the other layers extend continuously across the light collection path. In another embodiment, all of the layers are patterned to form a gap between the first and second electroluminescent regions. The layer stack is hermetically sealed to protect the active layer or layers from atmosphere-induced degradation. An illumination collector is aligned with the light collection path to receive light that is backreflected from a surface of interest through the light collection path. The illumination collector may be an optical arrangement, a photodetector, or both. In the preferred embodiment, the electroluminescent layer stack is an organic light-emitting source.

20 Claims, 4 Drawing Sheets

ELECTROLUMINESCENT DEVICE AND FABRICATION METHOD FOR A LIGHT DETECTION SYSTEM

TECHNICAL FIELD

The invention relates generally to light detection systems and more particularly to illumination-and-detection devices for such systems.

BACKGROUND ART

Many light detection systems require artificial illumination sources in order to ensure that the system has sufficient light for reliable performance. For example, a scanner may include an illumination source—to provide the necessary print-to-background contrast for forming image signals representative of a scanned original. A high contrast level enhances the signal-to-noise ratio (SNR) of image signals generated by one or more photodetectors. The enhanced SNR increases the accuracy of image reproduction. Moreover, high contrast levels also permit the scanning operation to be performed at a higher speed.

The selection of an appropriate illumination source for a light detection system depends upon a number of factors. A multi-feature photocopier typically utilizes a fluorescent lamp to permit high speed document reproduction. In comparison, illumination sources for a hand-held scanner must be compact and energy efficient.

An attractive approach to providing a compact, low energy illumination source for a detection system is an electroluminescent device that emits light from a planar surface in response to an excitation signal. Thick film and thin film electroluminescent devices are well known. One or more active layers may be sandwiched between two electrode layers connected to a voltage source. At least one of the electrode layers is transparent. When a potential difference is applied by means of the two electrode layers, energy is emitted at specific wavelengths that depend upon the selection of the active layers. The radiation passes through the transparent electrode and may be used to provide a generally uniform illumination field on a surface of interest, such as a document. A charge coupled device (CCD) array or other detector arrangement may be used to form signals representative of light scattered from the surface of interest. A concern is that the intensity of the illumination field drops off considerably with distance from the electroluminescent device. The reduced intensity may adversely affect performance of the detection system, particularly if the detector array is adjacent to the electroluminescent device in a surface-contact application, i.e., an application in which the device is brought into contact or near contact with the surface of interest. The radiating region of the electroluminescent device does not typically extend to the edge of the device, since the layers are hermetically sealed. Humidity and oxygen significantly reduce the useful life of most electroluminescent devices. Consequently, the edges of the device are sealed to exclude water and oxygen from the active layers. The seal reduces the susceptibility of the device to rapid degradation, but increases the distance between the radiating region and the field of view of the CCD array or other light detection device, as shown in FIG. 1. The seals 11 and 13 in FIG. 1 protect the electroluminescent layer stacks 15 and 17. Each layer stack is sandwiched between a pair of transparent substrates 19, 21, 23 and 25. A space between the two pairs of substrates allows light reflected from a document 27 to pass to an optical arrangement 29, as represented by the vertical line from the document to the optical arrangement. The presence of the seals 11 and 13 at the edges of the layer stacks 15 and 17 determines the minimum distance between the radiation regions of the layer stacks and the field of view of the optical arrangement 29.

U.S. Pat. No. 5,491,384 to Cheng et al. describes a light source for use in a surface-contact application, such as scanning a document for facsimile transmission. An electroluminescent source is formed between two water-proof layers. A narrow slot is then formed through the device. The device is fastened to a scanning face glass that is to be brought into contact with the surface of interest. Light reflected from the surface of interest passes through the narrow slot to a lens of a contact image sensor. Because the narrow slot is formed directly through the active layers, there is no sealant at the narrow slot. While this arrangement improves the intensity distribution into the line of sight of the sensor, it exposes the active layers to moisture and oxygen. What is needed is a device which provides substantially uniform illumination intensity over a region of interest to a light detection system in a compact and energy efficient manner. What is further needed is a method of fabricating such a device so as to protect the device from atmosphere-induced degradation.

SUMMARY OF THE INVENTION

An electroluminescent device for a light detection system includes a layer stack which is patterned to define a light collection path for passage of backreflected light through the device. The layer stack includes first and second electrode layers on opposed sides of at least one active layer. In one embodiment, the layer stack extends continuously along a surface of a transparent substrate, but the second electrode layer is patterned to define the light collection path. In this embodiment, the first electrode and the active layers are transparent, allowing the backreflected light to propagate through the light collection path of the layer stack. An illumination collector, such as an array of focusing elements, is aligned with the light collection path to receive the backreflected light. The collector may be one or more photodetectors for forming image signals in response to the detection of the backreflected light.

The layer stack preferably is an organic electroluminescent structure. The layers may be formed using deposition techniques typical of layer deposition for integrated circuit fabrication. For example, thermal evaporation or sputtering may be utilized. Preferably, the layers are "thin films," i.e., have a maximum thickness of 1500 Å.

The layers may be monolithically formed on a transparent substrate, such as a glass plate. A second transparent substrate or a moisture-proof seal is then connected so as to hermetically seal the electroluminescent layer stack. The moisture-proof seal may be formed by one or more layers of organic or inorganic materials.

In another embodiment, more layers than merely the second electrode layer are patterned to define the light collection path. Discontinuities in the layers form first and second electroluminescent regions on opposite sides of a gap that allows backreflected light to reach one or more photodetectors. The electroluminescent regions are hermetically sealed between a pair of transparent members, such as glass substrates, or a moisture-proof seal is applied over and between the two electroluminescent regions. Since the gap is hermetically sealed, active layers of the electroluminescent regions are not exposed to the atmosphere. Preferably, the layers of the first and second electroluminescent regions are formed simultaneously. However, there may be some applications in which the two electroluminescent regions are formed separately along the transparent member. For example, there may be an advantage to providing electroluminescent regions that radiate energy at different wavelengths.

An advantage of the invention is that the emission regions of the electroluminescent device may be abutted with the periphery of the light collection path from a surface of interest to detection optics, while protecting the active layers from the adverse effects of exposure to the atmosphere. Thus, a greater intensity on the surface of interest is available than would be achieved if a seal were necessary at the edge of the emission region. It is believed that the efficiency of coupling the emitted light to the surface of interest and then to the detection optics can be increased by a factor of at least three. Thus, as compared to prior art electroluminescent sources for detection systems, the brightness of the source can be reduced without a loss of surface illumination, thereby extending the operating life of the source. For portable applications, the battery life is extended.

Another advantage of the invention is that the fabrication techniques are generally straightforward. In the preferred embodiment of providing organic electroluminescent regions, known techniques for fabricating organic light-emitting diodes may be utilized. However, Group II–VI electroluminescent devices may also be fabricated on transparent substrates to provide the sealed light collection path that achieves the advantages.

BEST MODE FOR CARRYING OUT THE INVENTION

Figure 2:
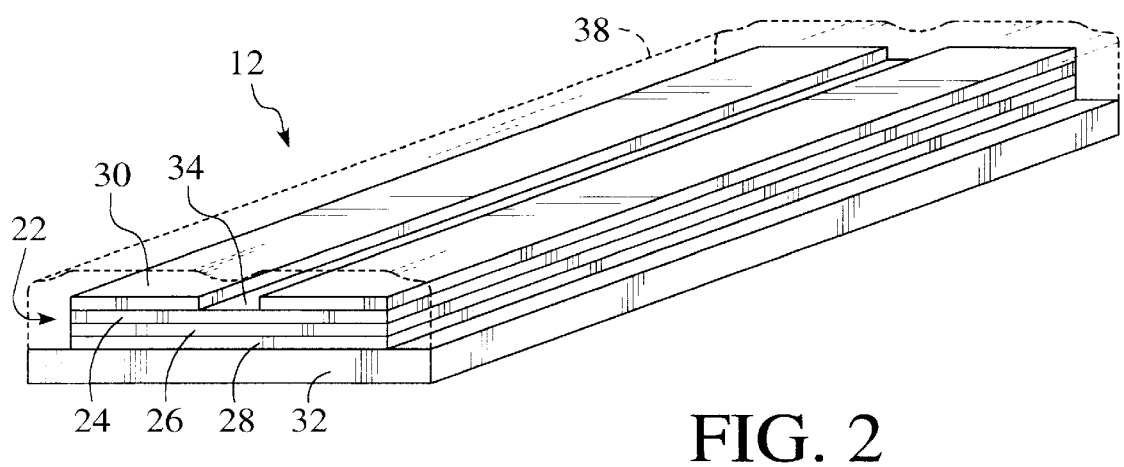
FIG. 2 is a perspective view of a sealed electroluminescent device having a light collection path through a layer stack.
Figure 3:
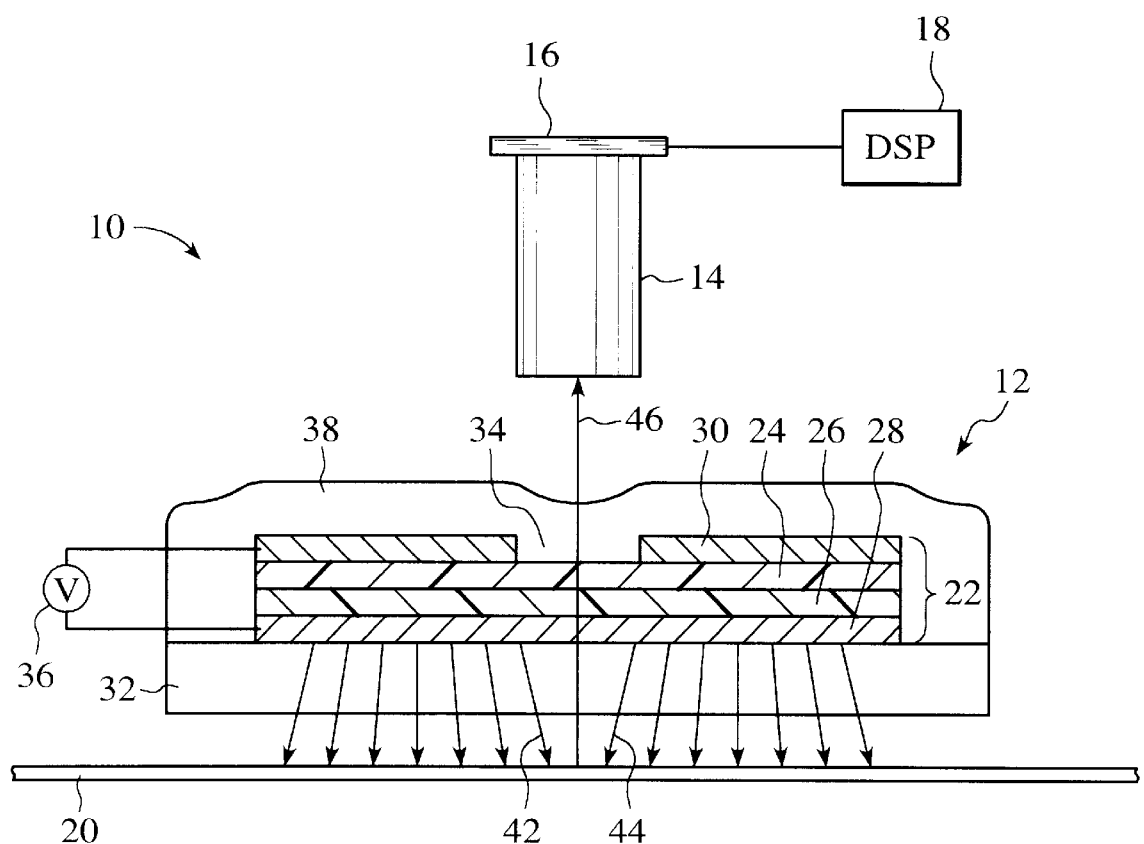
FIG. 3 is a side sectional view of a detection system having the electroluminescent device of FIG. 2 in accordance with one embodiment of the invention.

With reference to FIGS. 2 and 3, a light detection system 10 includes an electroluminescent source 12, an optical arrangement 14, and a photodetector 16. The optical arrangement and the photodetector are conventional components. For example, the optical arrangement may be a lens which focuses light introduced at the lower end, as viewed in FIG. 2, onto the photodetector 16 at the upper end. Lenses of this type are utilized in scanners, and are sometimes referred to as "rod lenses." While only one lens is shown in FIG. 3, scanners typically include an array of such lenses. Still referring to scanner applications, there is a linear array of photodetectors 16. The linear arrays are aligned perpendicular to the view of FIG. 3.

The photodetector 16 generates a signal that is responsive to the light received from the optical arrangement 14. The signal is output to a digital signal processor (DSP) 18. In the preferred embodiment, the signal is an image signal. For example, the light detection system 10 may be contained within the housing of a hand-held scanner for producing an image of a document 20 or another surface of interest. However, the light detection system 10 may be used in non-imaging applications. For example, the system may be used in an application in which it is necessary only to determine whether a surface is in alignment with the optical arrangement 14 or is misaligned. In such an application, reproduction of the surface is not required and the processing of the DSP 18 is simplified.

The electroluminescent source 12 is used to illuminate the surface of the document 20. An "electroluminescent source" is defined herein as a source of illumination that is generated by layers of organic, Group II–VI, or other materials in response to a flow of current through the materials. However, the preferred embodiment is one in which the electroluminescent source 12 is a flat, distributed source, and is an organic light-emitting structure.

Figure 4:
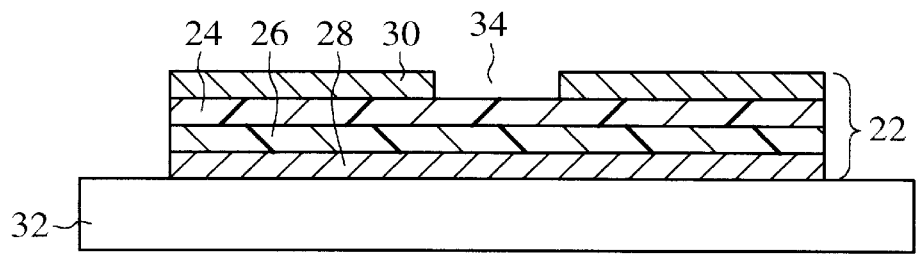
FIG. 4 is a side sectional view of an electroluminescent layer stack on the transparent substrate of FIG. 2.

Referring now to FIGS. 2, 3 and 4, an example of an organic electroluminescent layer stack 22 is shown as including a pair of active layers 24 and 26 between a lower electrode layer 28 and an upper electrode layer 30. A four-layer stack is not critical to the invention. Electroluminescent devices having a single active layer or having more than two active layers may be utilized. Moreover, some devices could include dielectric layers. The layer stack 22 is formed on a transparent substrate 32. Preferably, the transparent substrate is a glass plate, but this is not critical.

The lower electrode layer 28 is formed of a transparent conductive material. Indium tin oxide (ITO) having a sheet resistance of approximately 10–100 ohms/square is an acceptable material. ITO-coated glass plates are commercially available. Organic active layers 24 and 26 may be thermally vacuum-deposited organic layers. The lower active layer 26 may be triphenyldiamine (TPD) which is vacuum deposited to a thickness of approximately 600 Å. The TPD layer acts as the hole transport layer for the electroluminescent device. The second active organic layer 24 is the luminescing layer. An acceptable material is tris-hydroxyquinoline aluminum ($Alq_3$). This upper active layer may have a thickness of 600 Å. Both of the active layers are transparent.

The upper electrode layer 30 may be a layer of magnesium (Mg) having a thickness of 1000 Å. Optionally, the thermal deposition of the Mg layer is followed by a thermal deposition of silver (Ag) to provide an oxidation protection layer for the Mg layer. An acceptable thickness of the Ag layer is 1000 Å. Preferably, the deposition of the Mg/Ag metallic bilayer 30 follows the organic layer deposition without interruption of vacuum, thereby avoiding exposure of the $Alq_3$ layer 24 to air. Vacuum deposition at approximately $2 \times 10^{-7}$ Torr may be used for the active layers 24 and 26 and the electrode bilayer 30.

As shown in FIGS. 2, 3 and 4 the upper electrode layer 30 is patterned to define a light collection path 34 between first and second electroluminescent regions. Techniques for patterning the metallic electrode bilayer 30 are well known in the art. For example, shadow mask techniques may be utilized. The gap in the electrode layer defines first and second electroluminescent regions, since the electric field required to initiate luminescence is not established within the light collection path 34 when an excitation signal is applied to the lower and upper electrode layers 28 and 30. In FIG. 3 the excitation signal is provided by a voltage source 36.

As is well known in the art, the active layers 24 and 26 are susceptible to humidity-induced and oxygen-induced degradation. Organic light-emitting diodes degrade rapidly when exposed to the atmosphere. Consequently, the preferred embodiment encapsulates the layer stack 22 of FIG. 3. A hermetic seal is formed around the layer stack 22. As will be explained more fully below, the structure for forming the hermetic seal should be transparent within the light collection path 34, thereby allowing backreflected light to pass through the structure. FIGS. 2 and 3 illustrate one embodiment of the sealing structure. In this embodiment, a moisture-proof layer 38 is formed atop the layer stack 22. The layer 38 may be a transparent polymer, such as one of the thermoplastic resins referred to as a saran. Alternatively, the layer 38 may be an organic material, such as $Si_3N_4$ or $SiO_2$, or may consist of multiple organic and/or inorganic films. The layer extends along the sides of the layer stack and fills that portion of the light collection path 34 which is formed by patterning the upper electrode layer 30.

In operation, the voltage source 36 applies an excitation signal to the lower and upper electrode layers 28 and 30. While not shown in FIG. 2, there is an electrical connection between the regions of the upper electrode layers that are spaced apart by the light collection path 34. For example, there may be a strip of the electrode material that extends across either or both of the forward and rearward peripheries of the electrode layer 30, as viewed in FIG. 2. If separate strips are used at both the forward and rearward peripheries, the gap that defines the light collection path will be framed by the electrode material. In some applications, there may be advantages to having separate excitation signals to the two portions of the upper electrode layer, so that the two portions should be electrically isolated and a second voltage source 36 should be added.

Applying the excitation signal to the lower and upper electrode layers 28 and 30 causes the first and/or second electroluminescent regions to radiate light. The electroluminescent regions are flat, distributed sources. Light intensity decreases rapidly with distance from the edge of such a source. However, in the embodiment of FIG. 3, intensity remains relatively uniform, because each of the first and second illumination regions radiates light onto that portion of the document 20 that is aligned with the light collection path 34. A number of rays are schematically shown in FIG. 3. An edge ray 42 from the first electroluminescent region is shown as radiating across approximately one half of the lateral distance of the central gap in the electrode 30. In like manner, an edge ray 44 of the second electroluminescent region is schematically shown as radiating across approximately one half of the lateral distance of the central gap. Thus, the combination of the radiation from the two electroluminescent regions illuminates the entire portion of the document that is aligned with the optical arrangement 14.

Figure 1:
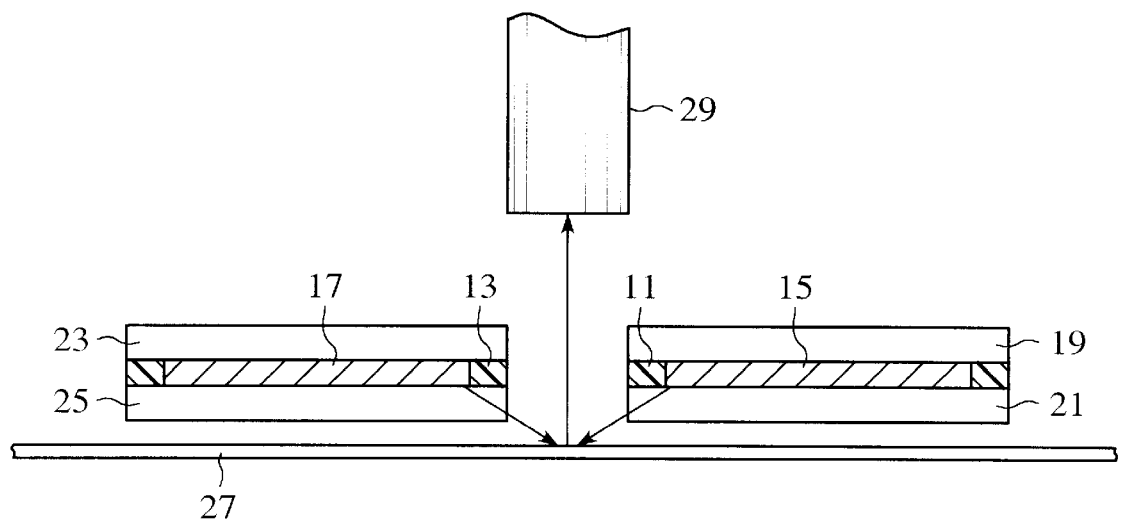
FIG. 1 is a side sectional view of a prior art electroluminescent device for illuminating a document of interest.

Backreflected light from the surface of interest 20 enters the light collection path 34 between the first and second electroluminescent regions. A backreflected ray 46 is shown as passing through the electroluminescent source 12. The backreflected ray 46 is incident to the optical arrangement 14. As previously noted, the optical arrangement preferably focuses the incident backreflected light onto a photodetector 16 that outputs an electrical signal to the signal processing unit 18. While the lower transparent substrate 32 is shown as being slightly spaced apart from the surface of interest 20, this is not critical. Hand-held scanners could allow contact of the surface of the transparent substrate 32 with the surface of interest 20. The thickness of the lower transparent substrate and the lateral dimension of the light collection path may be selected to ensure that full illumination is achieved across the portion of the surface of interest that is within the line of sight of the optical arrangement 14. An acceptable thickness for the transparent substrate 32 is one millimeter. It is believed that the efficiency of coupling the emitted light from the electroluminescent source to the detection of the backreflected light can be increased by a factor of at least three, relative to conventional prior art approaches. For example, if structural and operational considerations define a dimensional requirement of 1 mm for each of (1) the substrate thickness, (2) the width of the light collection path, and (3) the width of the sealing material which necessarily extends beyond each edge of the light emitting surface, then the invention increases the illumination on the scanline by a factor of four (relative to the prior art device of FIG. 1 in which separate light sources are formed on opposite sides of a light collection path and the sealing material 11 and 13 must be formed at the edges of the electroluminescent layer stacks 15 and 17, so that no emission takes place immediately adjacent to the field of view of the optical arrangement 29). Thus, the battery life of a hand-held scanner can be prolonged by reducing the brightness of the electroluminescent source. This brightness reduction also extends the operating life of the source.

Figure 5:
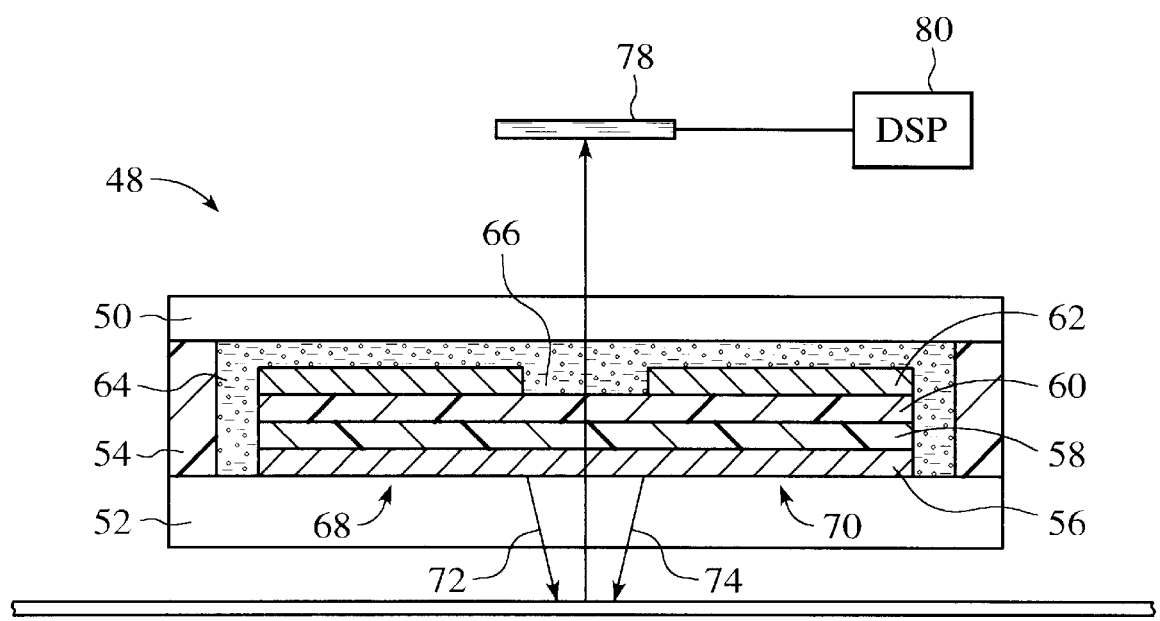
FIG. 5 is a side sectional view of a detection system having a gas-sealed illumination source in accordance with a second embodiment of the invention.

A second embodiment of the invention is shown in FIG. 5. In this embodiment, an electroluminescent source 48 includes upper and lower transparent substrates 50 and 52 attached by an epoxy or other sealant 54. The sealant is selected to provide a hermetic seal for an electroluminescent layer stack that includes a lower electrode layer 56, a pair of active layers 58 and 60 and an upper electrode layer 62. In this embodiment, the layer stack is spaced apart from the sealant and the upper substrate 50 by a gas-filled space 64. The gas within the space 64 is an inert gas, such as argon or nitrogen. The gas is also contained within a light collection path 66 defined by a patterned gap in the upper electrode 62. The light collection path is identical to the one described with reference to FIGS. 2–4.

The layers 56, 58, 60 and 62 also may be identical to the layers described with reference to FIGS. 2–4. Thus, the lower electrode layer 56 may be a coating of ITO on a glass substrate 52, the lower active layer 58 may be TPD, the upper active layer 60 may be $Alq_3$, and the upper electrode layer 62 may be separate films of Mg and Ag.

In operation, each of the two electroluminescent regions 68 and 70 radiates light in response to an excitation signal. The source of the signal is not shown in FIG. 5. Edge rays 72 and 74 are illustrated as extending angularly onto a portion of a surface of interest 76 that is in alignment with the light collection path 66. Backreflected light passes through the two transparent substrates 50 and 52 and through the light collection path 66 to a photodetector 78 which generates signals to a DSP 80. Optionally, the system of FIG. 5 also includes an optical arrangement aligned with the light collection path to focus the backreflected radiation onto the photodetector 78.

Figure 6:
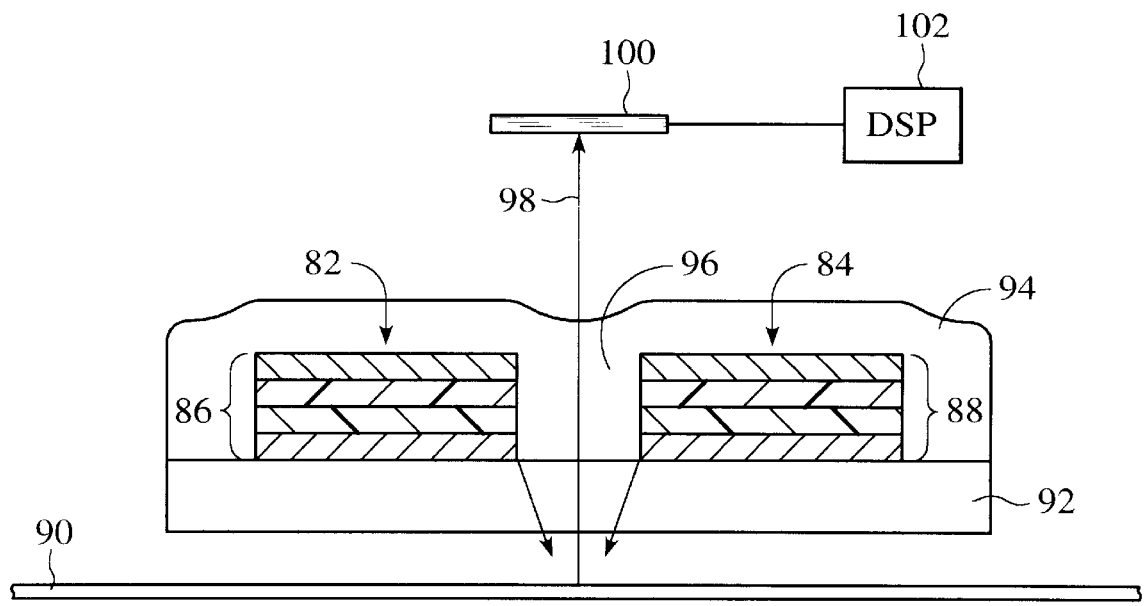
FIG. 6 is a side sectional view of a detection system having a divided electroluminescent stack in accordance with a third embodiment of the invention.

FIG. 6 illustrates a third embodiment of the invention. In this embodiment, a first electroluminescent region 82 is spaced apart from a second electroluminescent region 84. The two regions may be fabricated by patterning each of the layers in a layer stack. Alternatively, the layer stack 86 that forms the first electroluminescent region 82 may be formed independently of the layer stack 88 that forms the second electroluminescent region. In this alternative embodiment, the two regions may emit radiation having different characteristics. For example, there may be applications in which it is advantageous to utilize light of two different colors in illuminating the surface of a document 90.

The layer stacks 86 and 88 are fabricated onto a transparent substrate 92 using integrated circuit fabrication techniques. The layers are preferably thin film layers. While each stack is shown as having four layers, this is not critical. In some material systems, electroluminescence can be generated using a single active layer. With other materials, more than two organic layers are beneficial. A polymer or an inorganic material such as $SiO_2$ and $Si_3N_4$ may be conformally applied to cover the layer stacks. The material 94 will extend into a light collection path 96 between the two layer stacks.

In operation, light from each of the two layer stacks 86 and 88 of the electroluminescent regions 82 and 84 is directed onto the surface of the document 90. Backreflected radiation 98 passes through the light collection path 96 and is received at a photodetector 100. The electrical signal that is responsive to the received backreflected radiation is processed at a DSP 102 using conventional techniques. The operations of the photodetector and the DSP are not critical to the invention.

Figure 7:
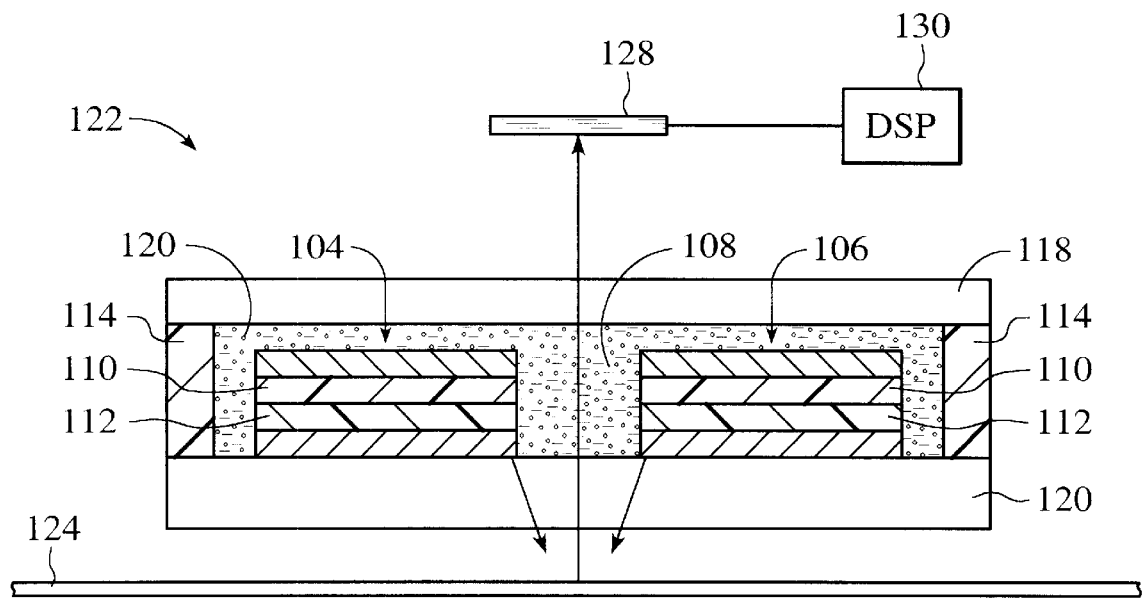
FIG. 7 is a side sectional view of a detection system having a gas-sealed illumination source in accordance with a fourth embodiment of the invention.

The embodiment of FIG. 7 is similar to that of FIG. 6. First and second electroluminescent regions 104 and 106 are spaced apart by a light collection path 108. The layers that form the two regions may be fabricated simultaneously or independently. Independent fabrication of at least the active layers 110 and 112 allows the two regions to have different properties, e.g., different colors or intensities.

The means for sealing the two electroluminescent regions 104 and 106 is similar to that used in the embodiment of FIG. 5. A sealant 114 hermetically encapsulates first and second transparent substrates 116 and 118. An inert gas is sealed between the two substrates to provide the inert atmosphere conducive to ensuring an extended useful life of the two electroluminescent regions 104 and 106. The operation of the electroluminescent source 122 is the same as the operation of FIG. 6. Light is directed from each of the regions 104 and 106 onto the surface of the document 124. Backreflected light is received at a detector 128, which provides a responsive electrical signal to a DSP 130.

While the invention has been described as receiving "backreflected" radiation at the photodetector, this is to be understood as including backscattered radiation and/or diffracted radiation from the surface of interest.

I claim:

1. A device for a light detection system comprising:
    a transparent substrate having opposed first and second surfaces;
    an electroluminescent layer stack having first and second electrode layers on opposed sides of an active layer, said layer stack extending continuously along said first surface of said transparent substrate, said second electrode layer being patterned to define a transparent light collection path for passage of backreflected light through said layer stack; and
    an illumination collector aligned with said illumination-free zone to receive said backreflected light.

2. The device of claim 1 further comprising a second transparent substrate between said layer stack and said illumination collector, said second transparent substrate being in contact with said layer stack such that said layer stack is between parallel transparent substrates.

3. The device of claim 2 wherein said transparent substrates are bonded along regions beyond edges of said layer stack, said layer stack being hermetically sealed between said transparent substrates.

4. The device of claim 1 wherein said second electrode layer is a patterned metal layer at a side of said layer stack opposite to said transparent substrate, said first electrode layer being a substantially transparent conductor layer.

5. The device of claim 1 wherein said illumination collector includes a linear array of focusing elements.

6. The device of claim 1 wherein said illumination collector includes an array of photodetectors.

7. The device of claim 1 wherein said layer stack forms an organic light-emitting diode.

8. An imaging system comprising:
    a first transparent member;
    first and second electroluminescent regions on said first transparent member for generating light in response to an excitation signal, said first and second electroluminescent regions being formed by a plurality of layers on a surface of said first transparent substrate, at least one of said layers being discontinuous to form a gap between said first and second electroluminescent regions;
    a seal fixed to said first transparent member and extending about said layers to hermetically seal said first and second electroluminescent regions and said gap; and
    detection means adjacent to said seal and aligned with said gap for forming image signals responsive to light passing through said gap.

9. The system of claim 8 wherein said layers which define said first and second electroluminescent regions include first and second electrode layers and at least one organic light-emitting layer.

10. The system of claim 9 wherein said seal includes a second transparent member and wherein said second electrode layer is on a side of said organic light-emitting layer proximate to said second transparent member, said second electrode layer being a patterned metallic layer having a discontinuity which exposes said organic light-emitting layer to form said gap.

11. The system of claim 8 wherein said detection means includes a linear array of photodetectors.

12. The system of claim 8 wherein said seal includes a second transparent substrate that is parallel to said first transparent substrate, said first and second transparent members being glass substrates bonded together to form a moisture-proof seal about said first and second electroluminescent regions.

13. The system of claim 8 wherein said seal is at least one conformal layer at edges of said plurality of layers and on a side of said layers opposite to said first transparent member.

14. A method of fabricating a device for use in a light detection system comprising steps of:
    providing a first transparent substrate;
    forming an electroluminescent layer stack on said first transparent substrate, including forming first and second electrode layers on opposed sides of an organic active layer and further including patterning at least one layer of said layer stack to define a light collection path for passage of light through said layer stack between first and second electroluminescent regions; and
    forming a moisture-proof seal to encapsulate said layer stack.

15. The method of claim 14 wherein said step of forming said electroluminescent layer stack includes forming said first electrode layer of a generally transparent material and forming said second electrode layer of an opaque metallic material, said second electrode layer being patterned to define said light collection path, said first electrode layer extending in a continuous fashion across said light collection path.

16. The method of claim 14 wherein said step of forming said moisture-proof seal includes attaching a second transparent substrate to said first transparent substrate such that said layer stack is sandwiched between said transparent substrates.

17. The method of claim 16 wherein said step of forming said moisture-proof seal further includes bonding said first and second transparent substrates along peripheries enclosing said layer stack.

18. The method of claim 14 wherein said steps of forming said moisture-proof seal includes applying at least one conformal layer onto said electroluminescent layer stack.

19. The method of claim 14 further comprising a step of aligning an illumination collector with said light collection path to receive backreflected light passing through said layer stack.

20. The method of claim 19 wherein said step of aligning said illumination collector includes positioning an optical focusing arrangement at a side of said layer stack opposite to said first transparent substrate.

* * * * *